(12) United States Patent
Jo et al.

(10) Patent No.: US 11,580,909 B2
(45) Date of Patent: Feb. 14, 2023

(54) ORGANIC LIGHT EMITTING DIODE DISPLAY DEVICE AND METHOD OF DRIVING THE SAME

(71) Applicant: LG Display Co., Ltd., Seoul (KR)

(72) Inventors: Sung-Min Jo, Paju-si (KR); Seung-Joon Jeon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/676,297

(22) Filed: Nov. 6, 2019

(65) Prior Publication Data

US 2020/0152126 A1 May 14, 2020

(30) Foreign Application Priority Data

Nov. 14, 2018 (KR) .......................... 10-2018-0139614

(51) Int. Cl.
*G09G 3/3258* (2016.01)
*H01L 27/32* (2006.01)
*H01L 27/12* (2006.01)

(52) U.S. Cl.
CPC ....... *G09G 3/3258* (2013.01); *H01L 27/3213* (2013.01); *H01L 27/3248* (2013.01); *H01L 27/3265* (2013.01); *H01L 27/3276* (2013.01); *G09G 2300/0426* (2013.01); *G09G 2320/0233* (2013.01); *H01L 27/124* (2013.01); *H01L 27/1255* (2013.01)

(58) Field of Classification Search
CPC ......... G09G 3/3258; G09G 2300/0426; G09G 2320/0233; G09G 2300/0819; G09G 2320/0295; G09G 2310/061; G09G 2310/067; G09G 2310/021; G09G 3/3233; G09G 3/3208–3291; G09G 2310/00–08; H01L 27/3213; H01L 27/3248; H01L 27/3265; H01L 27/3276; H01L 27/124; H01L 27/1255; H01L 27/326; H01L 27/3262

See application file for complete search history.

(56) References Cited

U.S. PATENT DOCUMENTS

| | | | | |
|---|---|---|---|---|
| 2006/0022913 A1* | 2/2006 | Takayanagi | .......... | G09G 3/3216 345/76 |
| 2006/0028463 A1* | 2/2006 | Nakamura | ............. | G11C 19/28 345/204 |
| 2006/0038767 A1* | 2/2006 | Nakamura | ........... | G09G 3/3677 345/100 |
| 2006/0284815 A1* | 12/2006 | Kwon | .................. | G09G 3/3614 345/98 |

(Continued)

FOREIGN PATENT DOCUMENTS

| KR | 2015-0055377 A | 5/2015 |
|---|---|---|
| KR | 10-2016-0056234 A | 5/2016 |

*Primary Examiner* — Roberto W Flores
(74) *Attorney, Agent, or Firm* — Seed IP Law Group LLP

(57) ABSTRACT

An organic light emitting diode display device includes: a substrate including a plurality of sub-pixels classified into a plurality of horizontal pixel lines; a gate line and a sensing line spaced apart from each other on the substrate; a data line and a power line crossing the gate line and the sensing line and spaced apart from each other; and first and second reference lines supplying first and second reference voltages, respectively, and connected to adjacent two, respectively, of the plurality of horizontal pixel lines.

22 Claims, 5 Drawing Sheets

(56) References Cited

U.S. PATENT DOCUMENTS

| | | | |
|---|---|---|---|
| 2007/0001937 A1* | 1/2007 | Park | G09G 3/3233 345/76 |
| 2008/0238854 A1* | 10/2008 | Kimura | G09G 3/3648 345/98 |
| 2009/0213056 A1* | 8/2009 | Nam | G09G 3/3648 345/90 |
| 2013/0342481 A1* | 12/2013 | Small | G06F 3/04166 345/173 |
| 2014/0340297 A1* | 11/2014 | Oke | G09G 3/3688 345/103 |
| 2015/0035735 A1* | 2/2015 | Kang | G09G 3/3291 345/77 |
| 2015/0062192 A1 | 3/2015 | Kim et al. | |
| 2015/0129853 A1 | 5/2015 | Shin et al. | |
| 2015/0179107 A1* | 6/2015 | Kim | G09G 3/3233 345/212 |
| 2015/0187267 A1* | 7/2015 | Park | G09G 3/3233 345/77 |
| 2016/0098960 A1* | 4/2016 | Park | G09G 3/3233 345/82 |
| 2016/0351096 A1* | 12/2016 | Tani | G09G 3/3233 |
| 2017/0004776 A1* | 1/2017 | Park | G09G 3/3208 |
| 2017/0154579 A1 | 6/2017 | Choi et al. | |
| 2017/0221419 A1 | 8/2017 | Xiang et al. | |

\* cited by examiner

110

ORGANIC LIGHT EMITTING DIODE DISPLAY DEVICE AND METHOD OF DRIVING THE SAME

CROSS-REFERENCE TO RELATED APPLICATIONS

This patent application claims priority to Republic of Korea Patent Application No. 10-2018-0139614, filed on Nov. 14, 2018, in the Korean Intellectual Property Office, which is incorporated herein by reference in its entirety.

BACKGROUND

Technical Field

The present disclosure relates to a display device and a method of driving the organic light emitting diode display device.

Description of the Related Art

Among the flat panel displays, an organic light emitting diode (OLED) display device has a relatively high luminance and a relatively low driving voltage.

Since the OLED display device has an emissive type, the OLED display device has a relatively great contrast ratio. In addition, since the OLED display device has a response time of several microseconds, the OLED display device has an advantage in displaying a moving image. The OLED display device also has a relatively wide viewing angle and is stable even under a relatively low temperature. Since the OLED display device is driven by a relatively low voltage of direct current (DC) 5V to 15V, a driving circuit can be easily designed and manufactured.

Further, since the OLED display device is fabricated through a deposition and an encapsulation, the OLED display device has a simplified fabrication process.

A plurality of thin film transistors (TFTs) such as a switching TFT, a driving TFT and a sensing TFT, a storage capacitor and a light emitting diode may be formed in each pixel of the OLED display device.

The sensing TFT is connected to the driving TFT and a reference line to initialize a source electrode of the driving TFT by applying a reference voltage to the source electrode. A threshold voltage of the driving TFT stored in the storage capacitor is reflected to a data signal such that a variation in the threshold voltage of the driving TFT is compensated.

The reference voltage is supplied to all the horizontal pixel lines of the OLED display device through a single reference line.

Recently, as a resolution increases, a technology that a sufficient charging time for each pixel is obtained by partially overlapping turn-on sections of the switching TFT and the sensing TFT in the adjacent horizontal pixel lines has been developed.

BRIEF SUMMARY

Embodiments relate to an organic light emitting diode display device where deterioration such as a horizontal bright line is prevented by supplying a reference voltage to adjacent horizontal pixel lines through different reference lines and a display quality is improved due to increase of a total luminance, and a method of driving the organic light emitting diode display device.

Advantages and features of the disclosure will be set forth, in part, in the description, which follows and, in part, will become apparent to those having ordinary skill in the art upon examination of the following or may be learned from practice of the disclosure. Other advantages and features of the embodiments herein may be realized and attained by the structure particularly pointed out in the written description and claims hereof as well as the appended drawings.

It is to be understood that both the foregoing general description and the following detailed description are explanatory, and are intended to provide further explanation of the embodiments as claimed.

BRIEF DESCRIPTION OF THE SEVERAL VIEWS OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

DETAILED DESCRIPTION

Figure 1:
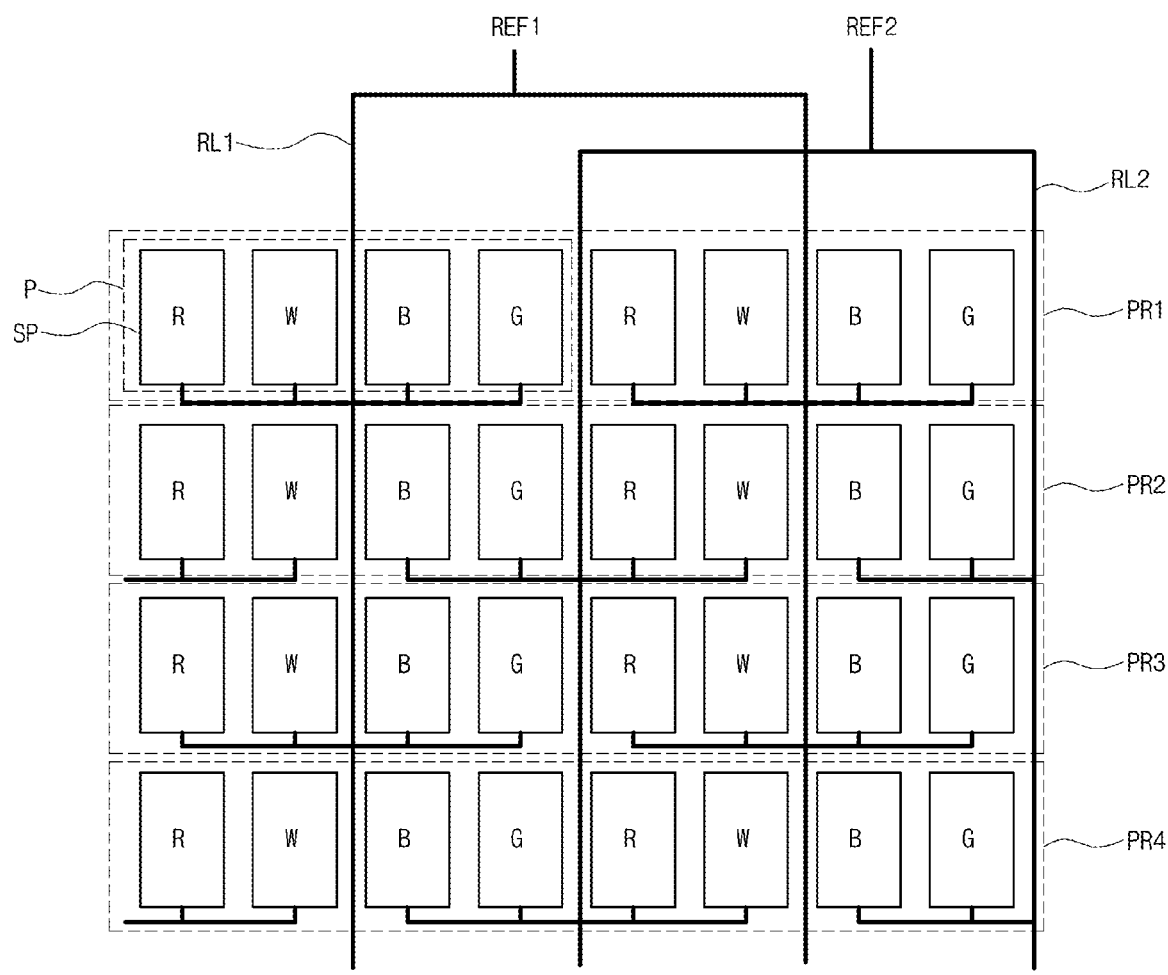
FIG. 1 is a view showing an organic light emitting diode display device according to an embodiment of the present disclosure.

Reference will now be made in detail to embodiments of the present disclosure, examples of which are illustrated in the accompanying drawings. In the following description, when a detailed description of well-known functions or configurations related to this document is determined to unnecessarily cloud a general understanding of an embodiment of the disclosure, the detailed description thereof will be omitted. The progression of processing steps and/or operations described is an example; however, the sequence of steps and/or operations is not limited to that set forth herein and may be changed, with the exception of steps and/or operations necessarily occurring in a certain order. Like reference numerals designate like elements throughout. Names of the respective elements used in the following explanations are selected only for convenience of writing the specification and may be thus different from those used in actual products.

FIG. 1 is a view showing an organic light emitting diode display device according to an embodiment of the present disclosure.

In FIG. 1, an organic light emitting diode (OLED) display device 110 according to an embodiment of the present disclosure includes a plurality of pixels P, and each of the plurality of pixels P includes a plurality of sub-pixels SP.

For example, each of the plurality of pixels P includes the plurality of sub-pixels SP displaying red, white, blue and green colors (R, W, B, G).

The plurality of pixels P may be classified into a plurality of horizontal pixel lines (e.g., pixel rows). For example, the plurality of pixels P may be classified into first, second, third and fourth horizontal pixel lines PR1, PR2, PR3 and PR4. Accordingly, the plurality of sub-pixels SP included in the plurality of pixels P may be classified into first, second, third and fourth horizontal pixel lines PR1, PR2, PR3 and PR4, respectively. Within the horizontal pixel lines PR1, PR2, PR3 and PR4, the subpixels SP of each pixel P are arranged adjacent to each other along each one of the horizontal pixel lines PR1, PR2, PR3 and PR4, so that first, second third and fourth sub-pixels SP (corresponding, for example, to red, white, blue and green colors) of each pixel P follow up to each other along a respective one of the horizontal pixel lines PR1, PR2, PR3 and PR4.

Although the OLED display device 110 exemplarily has a stripe structure where the red, white, blue and green sub-pixels SP are disposed in the same vertical pixel line (e.g., pixel column) by color in FIG. 1, the OLED display device 110 may have a mosaic structure where the red, white, blue and green sub-pixels SP are disposed in the different vertical pixel line (e.g., pixel column) by color or a delta structure where the red, white, blue and green sub-pixels SP are not disposed in a line but disposed to overlap each other along a vertical direction in another embodiment.

Each of the plurality of sub-pixels SP is connected to one of first and second reference lines RL1 and RL2. The plurality of sub-pixels SP in one of the two adjacent horizontal pixel lines are connected to one of the first and second reference lines RL1 and RL2, and the plurality of sub-pixels SP in the other of the two adjacent horizontal pixel lines are connected to the other of the first and second reference lines RL1 and RL2.

For example, the plurality of sub-pixels SP in an odd ((2k+1)th, where k is 0 or a positive integer) horizontal pixel line such as the first and third horizontal pixel lines PR1 and PR3 may be connected to the first reference line RL1, and the plurality of sub-pixels SP in an even ((2k)th, where k is a positive integer) horizontal pixel line such as the second and fourth horizontal pixel lines PR2 and PR4 may be connected to the second reference line RL2.

The first and second reference lines RL1 and RL2 are disposed along a vertical direction. The first and second reference lines RL1 and RL2 are alternately disposed by the two adjacent sub-pixels SP along a horizontal direction and each of the first and second reference lines RL1 and RL2 is repeatedly disposed by the four adjacent sub-pixels SP along the horizontal direction. Each of the four adjacent sub-pixels SP along the horizontal direction is connected to one of the first and second reference lines RL1 and RL2 through an extension line along the horizontal line.

For example, the first reference line RL1 may be disposed between the white and blue (W, B) along the vertical direction and may be repeatedly disposed by the blue, green, red and white (B, G, R, W) sub-pixels SP along the horizontal direction. The adjacent red, white, blue and green (R, W, B, G) sub-pixels SP may be connected to the first reference line RL1 through the extension line along the horizontal direction.

In addition, the second reference line RL2 may be disposed between the green and red (G, R) along the vertical direction and may be repeatedly disposed by the red, white, blue and green (R, W, B, G) sub-pixels SP along the horizontal direction. The adjacent blue, green, red and white (B, G, R, W) sub-pixels SP may be connected to the second reference line RL2 through the extension line along the horizontal direction.

In another embodiment, the first and second reference lines RL1 and RL2 may be disposed along a vertical direction. The first and second reference lines RL1 and RL2 may be alternately disposed by the four adjacent sub-pixels SP along a horizontal direction and may be repeatedly disposed by the eight adjacent sub-pixels SP along the horizontal direction. Each of the four adjacent sub-pixels SP along the horizontal direction may be connected to one of the first and second reference lines RL1 and RL2 through an extension line along the horizontal line.

First and second reference voltages REF1 and REF2 may be applied to the first and second reference lines RL1 and RL2, respectively. The first and second reference voltages REF1 and REF2 may have the same value and may be a constant voltage. The first and second reference voltages REF1 and REF2 may be applied by corresponding first and second reference voltage supplies, which can be provided to supply the respective reference voltages REF1 and REF2.

As a result, the plurality of sub-pixels SP in one of the two adjacent horizontal pixel lines are connected to one of the first and second reference lines RL1 and RL2, and one of the first and second reference voltages REF1 and REF2 is supplied to the plurality of sub-pixels SP in one of the two adjacent horizontal pixel lines. The plurality of sub-pixels SP in the other of the two adjacent horizontal pixel lines are connected to the other of the first and second reference lines RL1 and RL2, and the other of the first and second reference voltages REF1 and REF2 is supplied to the plurality of sub-pixels SP in the other of the two adjacent horizontal pixel lines.

For example, the plurality of sub-pixels SP in an odd ((2k−1)th, where k is a positive integer) horizontal pixel line such as the first and third horizontal pixel lines PR1 and PR3 may be connected to the first reference line RL1 and may receive the first reference voltage REF1. The plurality of sub-pixels SP in an even ((2k)th, where k is a positive integer) horizontal pixel line such as the second and fourth horizontal pixel lines PR2 and PR4 may be connected to the second reference line RL2 and may receive the second reference voltage REF2.

A structure of the plurality of sub-pixels SP of the OLED display device 110 will be illustrated with reference to a drawing.

Figure 2:
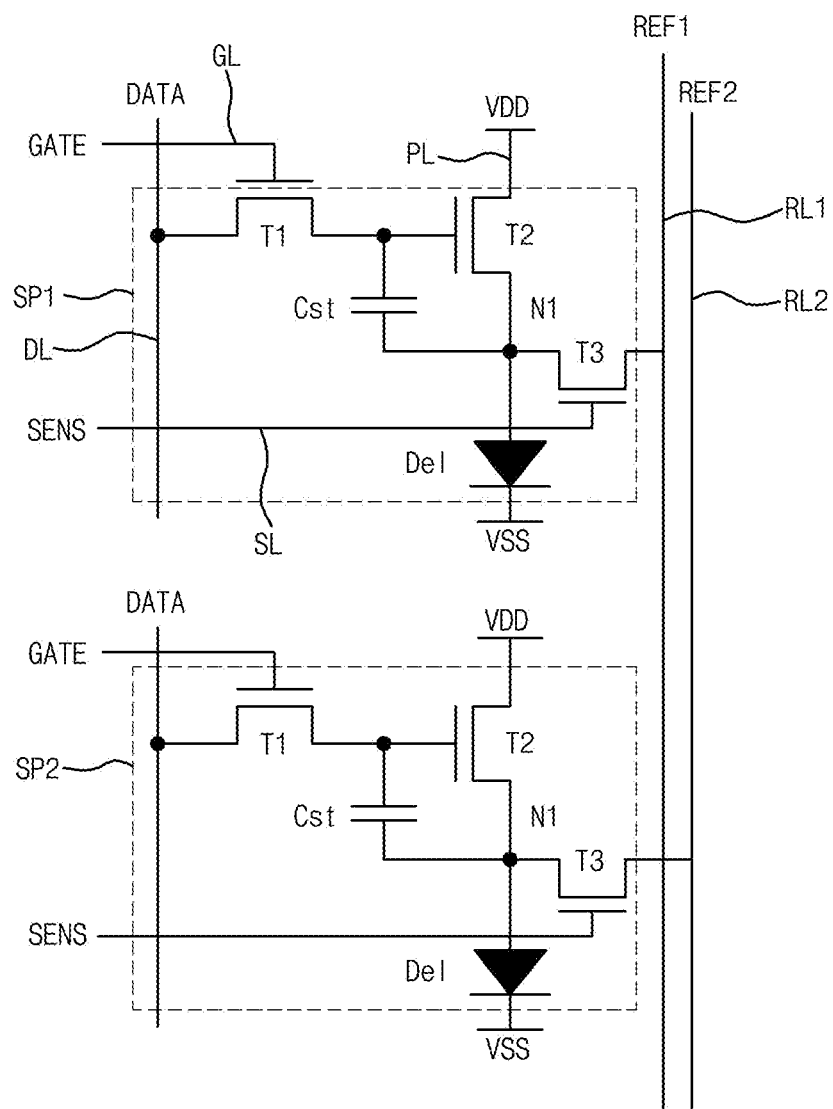
FIG. 2 is a view showing an equivalent circuit of a sub-pixel of an organic light emitting diode according to an embodiment of the present disclosure.

FIG. 2 is a view showing an equivalent circuit of a sub-pixel of an organic light emitting diode according to an embodiment of the present disclosure.

In FIG. 2, an organic light emitting diode (OLED) display device 110 (of FIG. 1) includes a plurality of sub-pixels SP (of FIG. 1) such as first and second sub-pixels SP1 and SP2 adjacent to each other along a vertical direction. The first and second sub-pixels SP1 and SP2 may belong to two adjacent horizontal pixel lines, respectively.

Each of the first and second sub-pixels SP1 and SP2 may be formed adjacent to a gate line GL, a sensing line SL, a data line DL, a power line PL and first and second reference lines RL1 and RL2 overlapping each other.

A gate voltage (or gate signal) GATE is supplied to the gate line GL, and a sensing voltage (or sensing signal) SENS is supplied to the sensing line SL. A data voltage (or data signal) DATA is supplied to the data line DL, and a high level voltage VDD is supplied to the power line PL. In addition, first and second reference voltages REF1 and REF2 are supplied to the first and second reference lines RL1 and RL2, respectively.

For example, the gate voltage GATE and the sensing voltage SENS may be a voltage including a pulse of the same timing, and the first and second reference voltages REF1 and REF2 may be a constant voltage of the same value.

First, second and third thin film transistors (TFTs) T1, T2 and T3, a storage capacitor Cst and a light emitting diode Del are disposed in each of the first and second sub-pixels SP1 and SP2.

Although not shown, each of the first, second and third TFTs T1, T2 and T3 may include a gate electrode, a semiconductor layer, a source electrode and a drain electrode. A gate insulating layer may be disposed between the gate electrode and the semiconductor layer, and a passivation layer may be disposed on the source electrode and the drain electrode.

In addition, the light emitting diode Del may include a first electrode of an anode, a light emitting layer and a second electrode of a cathode, and a color filter layer may be disposed in the plurality of sub-pixels SP.

The gate electrode, the source electrode and the drain electrode of the first TFT T1 of a switching TFT are connected to the gate line GL, the data line DL and the gate electrode of the second TFT T2, respectively.

The gate electrode, the source electrode and the drain electrode of the second TFT T2 of a driving TFT are connected to the drain electrode of the third TFT T3, an anode of the light emitting diode Del and the power line PL, respectively.

The gate electrode, the source electrode and the drain electrode of the third TFT T3 of a sensing TFT are connected to the sensing line SL, the source electrode of the second TFT T2 and one of the first and second reference lines RL1 and RL2, respectively. For example, the drain electrode of the third TFT T3 in the first sub-pixel SP1 may be connected to the first reference line RL1, and the drain electrode of the third TFT T3 in the second sub-pixel SP2 may be connected to the second reference line RL2.

The storage capacitor Cst is connected between the gate electrode and the source electrode of the second TFT T2.

The anode and the cathode of the light emitting diode Del are connected to the source electrode of the second TFT T2 and a low level voltage VSS, respectively.

In the OLED display device 110, when the first TFT T1 is turned on according to the gate voltage GATE of the gate line GL, the data voltage DATA of the data line DL is applied to the gate electrode of the second TFT T2 through the first TFT T1, and the second TFT T2 supplies a current corresponding to the data voltage DATA to the light emitting diode Del using the high level voltage VDD of the power line PL.

When the third TFT T3 is turned on according to the sensing voltage SENS of the sensing line SL, the first voltage REF1 of the first reference line RL1 or the second voltage REF2 of the second reference line RL2 is applied to the source electrode of the second TFT T2, and a threshold voltage of the second TFT T2 is stored in the storage capacitor Cst.

The threshold voltage of the second TFT T2 stored in the storage capacitor Cst in the first and second sub-pixels SP1 and SP2 is transmitted to a data driving unit (not shown) and a timing controlling unit (not shown) through the third TFT T3. The timing controlling unit generates a revised data voltage DATA by adding the threshold voltage of the second TFT T2 to the data voltage DATA and supplies the revised data voltage DATA to the first and second sub-pixels SP1 and SP2. The terms data driving unit and timing control unit as described herein may include any electrical circuitry, features, components, an assembly of electronic components or the like configured to perform the various operations as described herein with respect to the data driving unit and the timing control unit. In some embodiments, the data driving unit is referred to as a data driving circuit and may be included in or otherwise implemented by processing circuitry such as a microprocessor, microcontroller, integrated circuit, chip, microchip or the like. Similarly, the timing control unit is referred to as a timing control circuit and may be included or otherwise implemented based on the above enumerated circuitries.

A plane structure and a cross-sectional structure of the OLED display device 110 will be illustrated with reference to a drawing.

Figure 3:
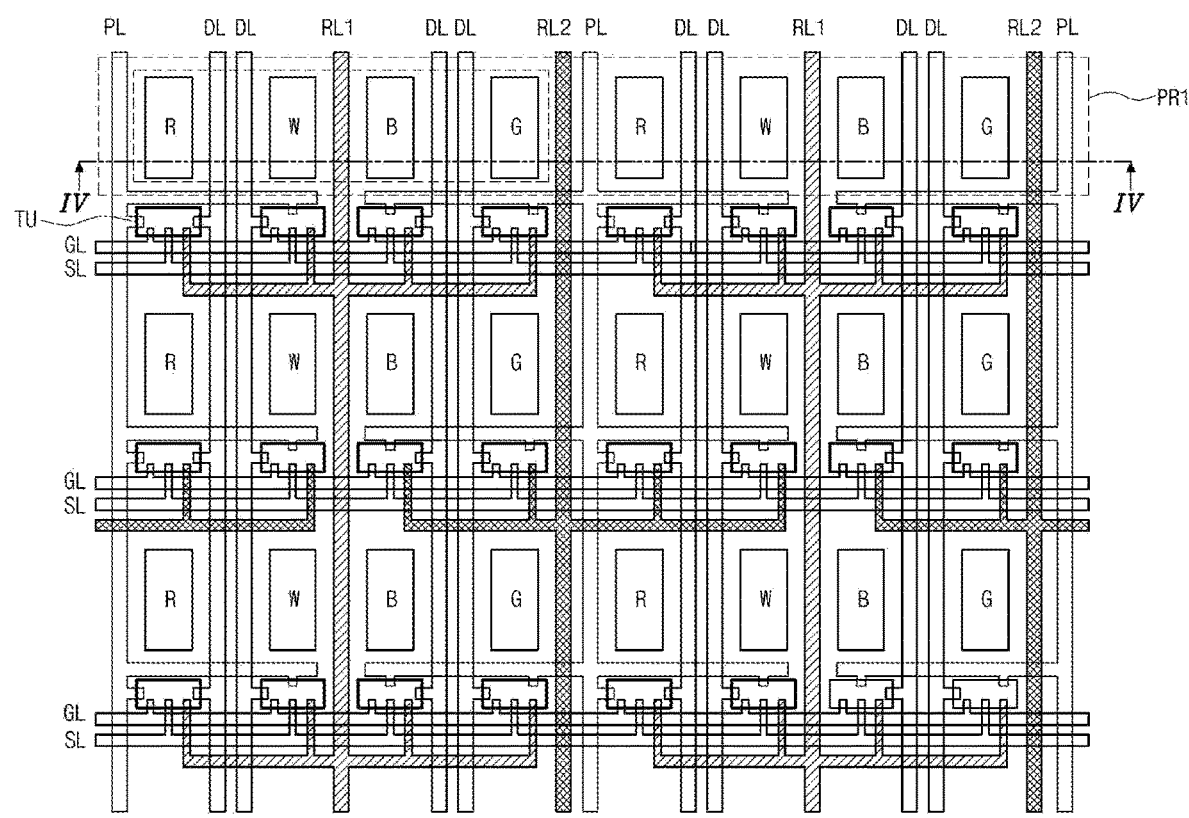
FIG. 3 is a plan view showing an organic light emitting diode display device according to an embodiment of the present disclosure.
Figure 4:
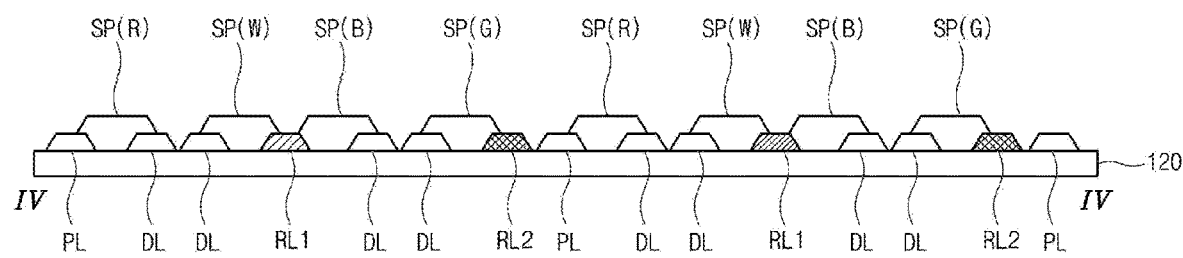
FIG. 4 is a cross-sectional view taken along a line IV-IV of FIG. 3.

FIG. 3 is a plan view showing an organic light emitting diode display device according to an embodiment of the present disclosure, and FIG. 4 is a cross-sectional view taken along a line IV-IV of FIG. 3.

In FIGS. 3 and 4, a gate line GL, a sensing line SL, a data line DL, a power line PL and first and second reference lines RL1 and RL2 are disposed on a substrate 120 of an organic light emitting diode (OLED) display device 110 according to an embodiment of the present disclosure.

A plurality of sub-pixels SP includes red, white, blue and green sub-pixels SP(R), SP(W), SP(B) and SP(G) constituting a single pixel P, and a transistor unit TU is disposed in a lower portion of each of the plurality of sub-pixels SP. The transistor unit TU may include one or more transistors as well as other electronic components, electrical connections, or the like.

Each of the plurality of sub-pixels SP may include a light emitting diode Del and a color filter layer (or an overcoat layer), and the transistor unit TU may include first, second and third TFTs T1, T2 and T3 and a storage capacitor Cst.

The plurality of pixels P may be classified into a plurality of horizontal pixel lines (pixel rows). For example, the plurality of pixels P may be classified into first, second, third and fourth horizontal pixel lines PR1, PR2, PR3 and PR4.

A gate line GL and a sensing line SL are parallel to a horizontal direction and spaced apart from each other. A data line DL, a power line PL and first and second reference lines RL1 and RL2 are parallel to a vertical direction and spaced apart from each other.

Although not shown, the gate line GL and the sensing line SL may include the same layer and the same material as a gate electrode of each of the first, second and third TFTs T1, T2 and T3. The data line DL, the power line PL and the first and second reference lines RL1 and RL2 may include the same layer and the same material as a source electrode and a drain electrode of each of the first, second and third TFTs T1, T2 and T3.

Extension lines of the gate line GL, the sensing line SL and the first and second reference lines RL1 and RL2 may be spaced apart from each other between the two adjacent horizontal pixel lines and may be connected to the transistor unit TU.

The two adjacent data lines DL may be disposed between the two adjacent sub-pixels SP and may be repeatedly disposed by the two adjacent sub-pixels SP along the horizontal direction. The two adjacent data lines DL may be connected to the transistor unit TU.

The power line PL may be disposed along the vertical direction. The power line PL may be alternately disposed with the first reference line RL1 or the second reference line RL2 by the two adjacent sub-pixels SP along the horizontal direction. The power line PL may be repeatedly disposed by the four adjacent sub-pixels SP along the horizontal direction. The transistor unit TU of the four adjacent sub-pixels SP along the horizontal direction may be connected to the power line through the extension line along the horizontal direction.

The first and second reference lines RL1 and RL2 may be disposed along the vertical direction. The first and second reference lines RL1 and RL2 may be alternately disposed by the two adjacent sub-pixels SP along the horizontal direction and may be repeatedly disposed by the four adjacent sub-pixels SP along the horizontal direction. The transistor unit TU of the four adjacent sub-pixels SP along the horizontal direction may be connected to one of the first and second reference lines RL1 and RL2 through the extension line along the horizontal direction.

For example, the first reference line RL1 may be disposed between the white and blue (W, B) sub-pixels SP along the vertical direction and may be repeatedly disposed by the blue, green, red and white (B, G, R, W) sub-pixels SP along the horizontal direction. The transistor unit TU of the adjacent red, white, blue and green (R, W, B, G) sub-pixels SP may be connected to the first reference line RL1 through the extension line along the horizontal direction.

The second reference line RL2 may be disposed between the green and red (G, R) sub-pixels SP along the vertical direction and may be repeatedly disposed by the red, white, blue and green (R, W, B, G) sub-pixels SP along the horizontal direction. The transistor unit TU of the adjacent blue, green, red and white (B, G, R, W) sub-pixels SP may be connected to the second reference line RL2 through the extension line along the horizontal direction.

A gate voltage (gate signal) GATE is supplied to the gate line GL, and a sensing voltage (sensing signal) SENS is supplied to the sensing line SL. A data voltage (data signal) DATA is supplied to the data line DL, and a high level voltage VDD is supplied to the power line PL. In addition, first and second reference voltages REF1 and REF2 are supplied to the first and second reference lines RL1 and RL2, respectively.

The gate voltage GATE and the sensing voltage SENS may have the same timing.

Figure 5:
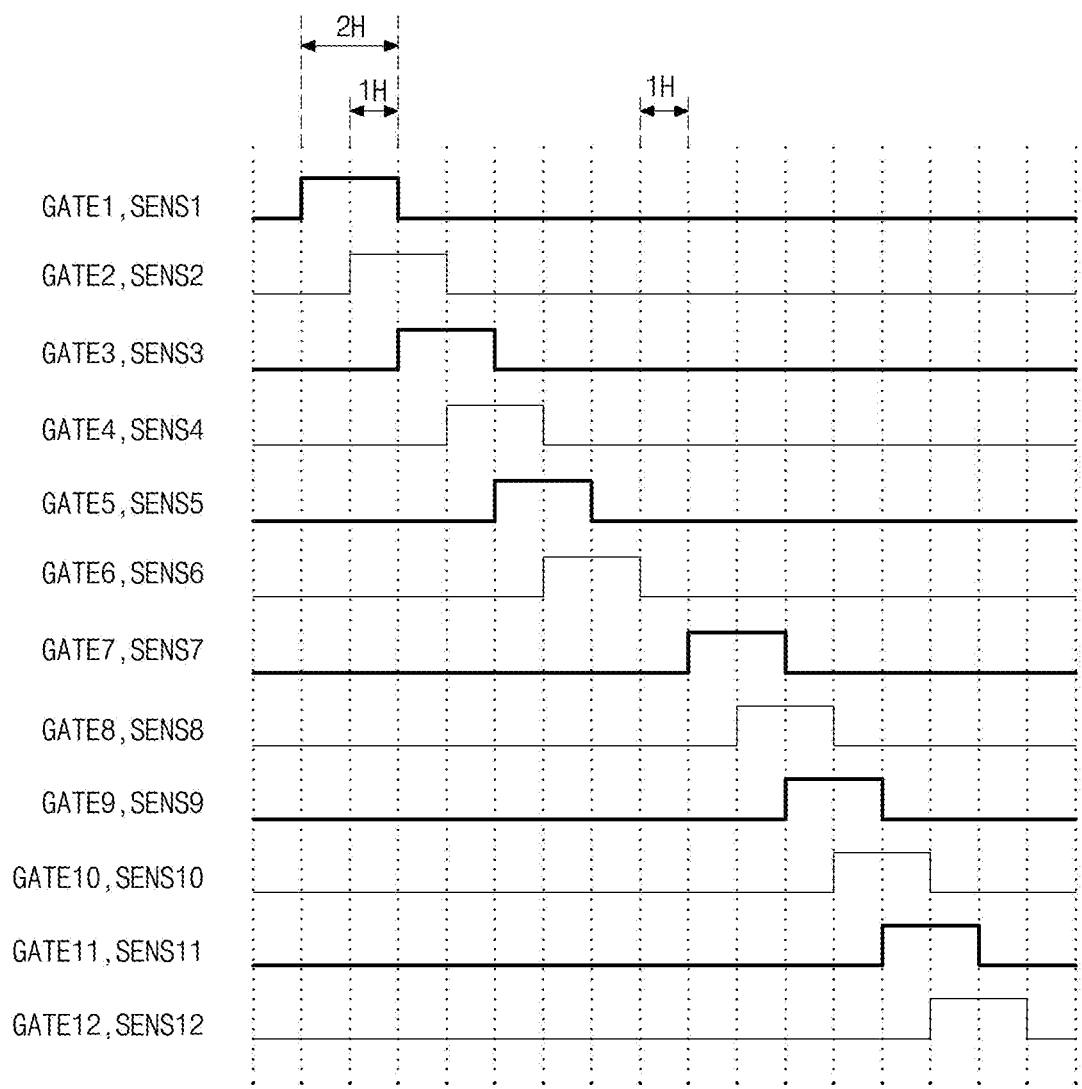
FIG. 5 is a timing chart showing a gate voltage and a sensing voltage of an organic light emitting diode display device according to an embodiment of the present disclosure.

FIG. 5 is a timing chart showing a gate voltage and a sensing voltage of an organic light emitting diode display device according to an embodiment of the present disclosure.

In FIG. 5, a gate voltage GATE and a sensing voltage SENS are supplied to a gate line GL (of FIG. 3) and a sensing line SL (of FIG. 3), respectively, of each horizontal pixel line PR (of FIG. 3) of an organic light emitting diode (OLED) display device 110 (of FIG. 3). The gate voltage GATE and the sensing voltage SENS may be a voltage including a pulse of the same timing.

The plurality of sub-pixels SP in an odd ((2k+1)th, where k is 0 or a positive integer) horizontal pixel line PR may be connected to the first reference line RL1 to receive a first reference voltage REF1. The plurality of sub-pixels SP in an even ((2k)th, where k is a positive integer) horizontal pixel line PR may be connected to the second reference line RL2 to receive a second reference voltage REF2.

For example, a first gate voltage GATE1 and a first sensing voltage SENS1 may be supplied to the gate line GL and the sensing line SL, respectively, in a first horizontal pixel line PR1, and a second gate voltage GATE2 and a second sensing voltage SENS2 may be supplied to the gate line GL and the sensing line SL, respectively, in a second horizontal pixel line PR2.

Similarly, third to twelfth gate voltages GATE3 to GATE12 may be supplied to the gate line GL in third to twelfth horizontal pixel lines, respectively, and third to twelfth sensing voltages SENS3 to SENS12 may be supplied to the sensing line SL in third to twelfth horizontal pixel lines, respectively.

Each of the first to twelfth sensing voltages SENS1 to SENS12 includes a pulse having a turn-on section of a high level, and the turn-on section of the pulse corresponds to two horizontal period 2H of the OLED display device 110.

A timing of the turn-on section of the first to twelfth sensing voltages SENS1 to SENS12 may be sequentially changed according to the horizontal pixel line PR.

To obtain a sufficient charging time, the turn-on sections of adjacent two of the first to sixth sensing voltages SENS1 to SENS6 partially overlap each other by one horizontal period 1H and the turn-on sections of adjacent two of the seventh to twelfth sensing voltages SENS7 to SENS12 partially overlap each other by one horizontal period 1H.

In addition, to insert a black data for prevention of a residual image, the turn-on sections of the sixth and seventh sensing voltages SENS6 and SENS7 do not overlap each other and are separated from each other.

In the OLED display device 110 driven by the sensing voltage SENS, deterioration such as a horizontal bright line may be prevented by supplying the first and second reference voltages REF1 and REF2 to the two adjacent horizontal pixel lines through the first and second reference lines RL1 and RL2, respectively.

Figure 6A:
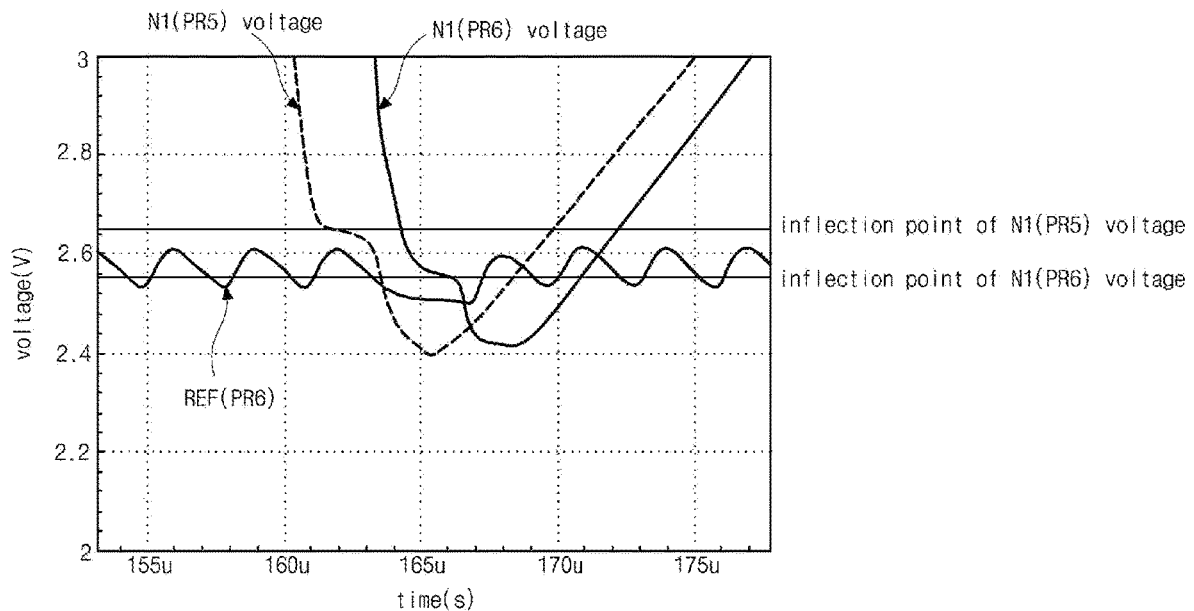
FIGS. 6A and 6B are graphs showing an inflection point of a voltage of a source electrode of a driving thin film transistor of an organic light emitting diode display device according to a comparison example and an embodiment of the present disclosure, respectively.
Figure 6B:
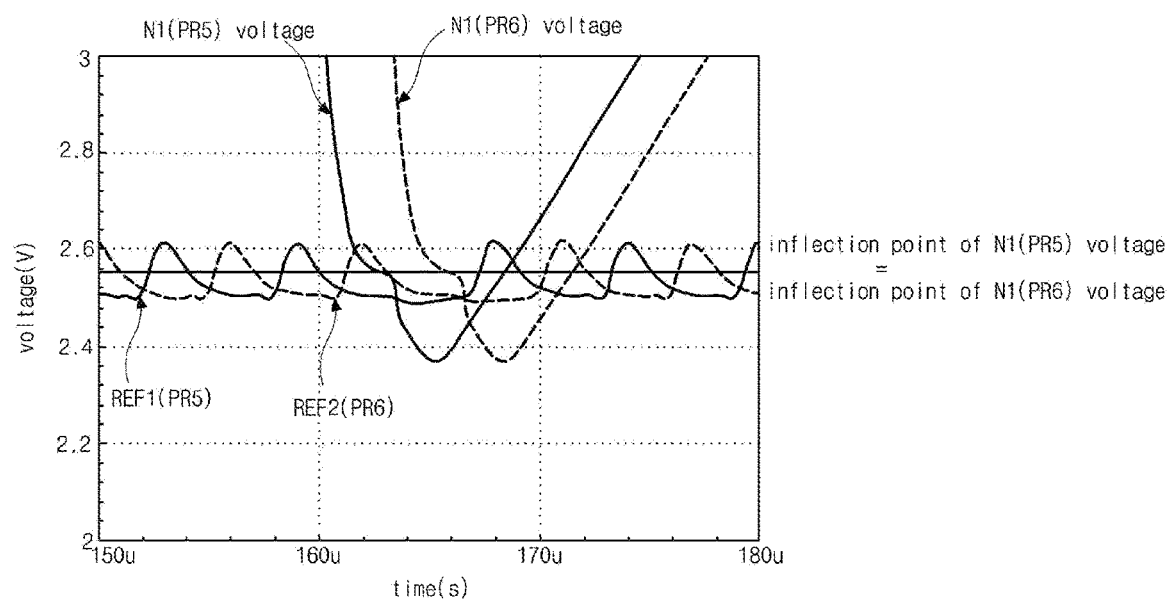

FIGS. 6A and 6B are graphs showing an inflection point of a voltage of a source electrode of a driving thin film transistor of an organic light emitting diode display device according to a comparison example and an embodiment of the present disclosure, respectively.

In FIGS. 6A and 6B, when the third thin film transistor (TFT) T3 is turned on by the sensing voltage SENS in each of the sub-pixels of the first to twelfth horizontal pixel lines of the organic light emitting diode (OLED) display device according to a comparison example and an embodiment of the present disclosure, the reference voltage is supplied to the source electrode of the second TFT T2 through the reference line, and the voltage of the source electrode of the second TFT T2 varies from a voltage of the previous frame to the reference voltage. The variation curve of the voltage of the source electrode of the second TFT T2 has an inflection point due to influence of elements such as the third TFT T3 connected to the reference line in the next horizontal pixel line.

The inflection point of the voltage of the source electrode of the second TFT T2 may be changed according to a state of the elements connected to the reference line.

As shown in FIG. 6A of the OLED display device according to the comparison example where the reference voltage is supplied to each sub-pixel in the first to twelfth horizontal pixel lines through one reference line, the source electrode of the second TFT T2 of each sub-pixel SP in the first to fifth horizontal pixel lines and the seventh to twelfth horizontal pixel lines where the turn-on section thereof overlaps the turn-on section of the next horizontal pixel line and the source electrode of the second TFT T2 of each sub-pixel SP in the sixth horizontal pixel line where the turn-on section thereof does not overlap and is separated from the turn-on section of the next horizontal pixel line have different inflection points.

The voltage of the source electrode (N1(PR5)) of the second TFT T2 of each sub-pixel SP in the fifth horizontal pixel line PR5 where the turn-on section thereof overlaps the turn-on section of the next sixth horizontal pixel line PR6 and the voltage of the source electrode (N1(PR6)) of the second TFT T2 of each sub-pixel SP in the sixth horizontal pixel line PR6 where the turn-on section thereof does not overlap and is separated from the turn-on section of the next seventh horizontal pixel line have different inflection points. As a result, the turn-on current of the second TFT T2 becomes non-uniform and deterioration such as a horizontal bright line occurs. As a result, a display quality of an image is deteriorated.

As shown in FIG. 6B of the OLED display device 110 according to an embodiment of the present disclosure, the first reference voltage REF1 is supplied to each sub-pixel SP in the odd horizontal pixel lines PR through the first reference line RL1 and the second reference voltage REF2 is supplied to each sub-pixel SP in the even horizontal pixel lines PR through the second reference line RL2 regardless of overlap of the turn-on section.

For example, the first reference voltage REF1 is supplied to each sub-pixel SP in the fifth horizontal pixel line PR5 where the turn-on section thereof overlaps the turn-on section of the next sixth horizontal pixel line PR6 through the first reference line RL1, and the second reference voltage REF2 is supplied to each sub-pixel SP in the sixth horizontal line PR6 where he turn-on section thereof does not overlap and is separated from the turn-on section of the next seventh horizontal pixel line through the second reference line RL2.

The voltage of the source electrode (N1(PR5)) of the second TFT T2 of each sub-pixel SP in the fifth horizontal pixel line PR5 where the turn-on section thereof overlaps the turn-on section of the next sixth horizontal pixel line PR6 and the voltage of the source electrode (N1(PR6)) of the second TFT T2 of each sub-pixel SP in the sixth horizontal pixel line PR6 where the turn-on section thereof does not overlap and is separated from the turn-on section of the next seventh horizontal pixel line have the same inflection points as each other. As a result, the turn-on current of the second TFT T2 becomes uniform and deterioration such as a horizontal bright line is prevented. As a result, a total luminance increases and a display quality of an image is improved.

Consequently, in the OLED display device according to the present disclosure, since the reference voltage is supplied to the adjacent horizontal lines through different reference lines, deterioration such as a horizontal bright line is prevented and total luminance increases. As a result, display quality of an image is improved.

According to the present disclosure, further aspects of a display device are provided. The display device includes: a plurality of pixels on a substrate, each of the pixels including one or more sub-pixels; a plurality of pixel groups, each of the pixel group having at least two pixels arranged in a first direction, the plurality of pixel groups including even number (2N) pixel groups and odd number (2N+1) pixel groups alternately arranged along a second direction transverse to the first direction, where N is a non-negative integer; a first reference line arranged along the second direction, the first reference line supplying a first reference voltage to the odd number pixel groups of the plurality of pixel groups; and a second reference line arranged along the second direction, the second reference line supplying a second reference voltage to the even number pixel groups of the plurality of pixel groups.

In one or more embodiments, the first reference line is divided into a first branch and a second branch, and the first branch connects to a first pixel of the odd number pixel groups and the second branch connects to a second pixel adjacent to the first pixel of the odd number pixel groups.

In one or more embodiments, the second reference line is divided into a third branch and a fourth branch, and the third branch connects to a third pixel of the even number pixel groups and the fourth branch connects to a fourth pixel adjacent to the third pixel of the even number pixel groups.

The aforementioned aspects of the display device also improve image quality and increase total luminance of the display.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the present disclosure.

The various embodiments described above can be combined to provide further embodiments. Further changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting diode display device, comprising:
   a substrate including a plurality of sub-pixels disposed in a plurality of horizontal pixel lines;
   a gate line and a sensing line spaced apart from each other on the substrate;
   a data line and a power line overlapping the gate line and the sensing line and spaced apart from each other; and
   first and second reference lines supplying first and second reference voltages, respectively, and connected to adjacent two, respectively, of the plurality of horizontal pixel lines,
   wherein the plurality of horizontal pixel lines include (n)th, (n+1)th, and (n+2)th horizontal pixel lines,
   wherein turn-on sections of sensing voltages supplied to the (n)th and (n+1)th horizontal pixel lines overlap each other during a horizontal period to obtain sufficient charge time of at least one of the plurality of sub-pixels,
   wherein turn-on sections of sensing voltages supplied to the (n)th and (n+2)th horizontal pixel lines are separated in time from each other by at least two horizontal periods and do not overlap each other during at least one or more horizontal periods,
   wherein turn-on sections of the sensing voltages supplied to the (n+1)th and (n+2)th horizontal pixel lines are separated in time from and do not overlap each other by only one horizontal period in order to insert black data, where n is a positive integer,
   wherein the turn-on sections of sensing voltages are two different horizontal periods, and
   wherein a period between the turn-on sections of the sensing voltages supplied to the (n+1)th and (n+2)th horizontal pixel lines is exactly a half of a period of the turn-on sections of sensing voltages respectively supplied to the (n)th, (n+1)th and (n+2)th horizontal pixel lines.

2. The display device of claim 1, wherein the display device is configured to:
supply the first reference voltage to the plurality of sub-pixels in odd ones of the plurality of horizontal pixel lines through the first reference line, and
supply the second reference voltage to the plurality of sub-pixels in even ones of the plurality of horizontal pixel lines through the second reference line.

3. The display device of claim 1, wherein the first and second reference lines extend along a vertical direction.

4. The display device of claim 3, wherein the first and second reference lines are alternately disposed along a horizontal direction.

5. The display device of claim 4, wherein each of a number of adjacent sub-pixels of the plurality of sub-pixels is connected to one of the first or second reference lines through an extension line along the horizontal direction.

6. The display device of claim 4, wherein the first and second reference lines are alternately disposed by adjacent two of the plurality of sub-pixels along the horizontal direction.

7. The display device of claim 6, wherein each of the first and second reference lines is repeatedly disposed by adjacent four of the plurality of sub-pixels along the horizontal direction, and
wherein each of adjacent four of the plurality of sub-pixels is connected to one of the first or second reference lines through an extension line along the horizontal direction.

8. The display device of claim 7, wherein the plurality of sub-pixels include first, second, third and fourth sub-pixels,
wherein the first reference line is disposed between the second and third sub-pixels and is repeatedly disposed by the third, fourth, first and second sub-pixels,
wherein the first, second, third and fourth sub-pixels are connected to the first reference line through the extension line,
wherein the second reference line is disposed between the fourth and first sub-pixels and is repeatedly disposed by the first, second, third and fourth sub-pixels, and
wherein the third, fourth, first and second sub-pixels are connected to the second reference line through the extension line.

9. The display device of claim 1,
wherein the first reference voltage is supplied to the plurality of sub-pixels in the (n)th horizontal pixel line through the first reference line, and the second reference voltage is supplied to the plurality of sub-pixels in the (n+1)th horizontal pixel line through the second reference line.

10. The display device of claim 1, wherein each of the plurality of sub-pixels includes first, second and third thin film transistors each including a gate electrode, a source electrode and a drain electrode, a storage capacitor and a light emitting diode,
wherein the gate electrode, the source electrode and the drain electrode of the first thin film transistor are connected to the gate line, the data line and the gate electrode of the second thin film transistor, respectively,
wherein the gate electrode, the source electrode and the drain electrode of the second thin film transistor are connected to the drain electrode of the third thin film transistor, an anode of the light emitting diode and the power line, respectively,
wherein the gate electrode, the source electrode and the drain electrode of the third thin film transistor are connected to the sensing line, the source electrode of the second thin film transistor and one of the first and second reference lines, respectively,
wherein the storage capacitor is connected between the gate electrode and the source electrode of the second thin film transistor, and
wherein the anode and a cathode of the light emitting diode are connected to the source electrode of the second thin film transistor and a low level voltage, respectively.

11. The display device of claim 1, wherein two adjacent data lines are disposed between adjacent two of the plurality of sub-pixels and are repeatedly disposed by adjacent two of the plurality of sub-pixels along a horizontal direction.

12. The display device of claim 1, wherein the power line is alternately disposed with the first reference line or the second reference line by adjacent two of the plurality of sub-pixels along a horizontal direction and is repeatedly disposed by adjacent four of the plurality of sub-pixels along the horizontal direction, and
wherein the power line is coupled to and supplies a high level voltage to adjacent four of the plurality of sub-pixels along the horizontal direction.

13. The display device of claim 1, wherein the plurality of horizontal lines further includes (n+3)th horizontal pixel line,
wherein the turn-on section of the sensing voltage supplied to the (n+2)th horizontal pixel line overlaps the turn-on section of the sensing voltage supplied to the (n+3)th horizontal pixel line for a half of a period of the turn-on sections of sensing voltages respectively supplied to the (n)th, (n+1)th and (n+2)th horizontal pixel lines and does not overlap any of the turn-on sections of the sensing voltages supplied to the plurality of horizontal pixel lines except for the (n+3)th horizontal pixel line.

14. A method of driving an organic light emitting diode including a plurality of sub-pixels disposed in a plurality of horizontal pixel lines, comprising:
supplying a gate voltage to the plurality of sub-pixels in each of the horizontal pixel lines through a gate line;
supplying a data voltage to the plurality of sub-pixels in each of the horizontal pixel lines through a data line;
supplying a sensing voltage to the plurality of sub-pixels in each of the horizontal pixel lines through a sensing line; and
supplying first and second reference voltages to two adjacent horizontal pixel lines through first and second reference lines, respectively,
wherein the plurality of horizontal pixel lines include (n)th, (n+1)th and (n+2)th horizontal pixel lines,
wherein turn-on sections of sensing voltages supplied to the (n)th and (n+1)th horizontal pixel lines overlap each other during a horizontal period to obtain sufficient charge time of at least one of the plurality of sub-pixels,
wherein turn-on sections of sensing voltages supplied to the (n)th and (n+2)th horizontal pixel lines are separated in time from and do not overlap each other during at least one or more horizontal periods,
wherein turn-on sections of the sensing voltages supplied to the (n+1)th and (n+2)th horizontal pixel lines are separated in time from and do not overlap each other by only one horizontal period in order to insert black data, where n is a positive integer, wherein the turn-on sections of sensing voltages are two different horizontal periods, and wherein a period between the turn-on sections of the sensing voltages supplied to the (n+1)th and (n+2)th horizontal pixel lines is exactly a half of a period of the turn-on sections of sensing voltages respectively supplied to the (n)th, (n+1)th and (n+2)th horizontal pixel lines.

15. The method of claim 14, wherein supplying the first and second reference voltages comprises:

supplying the first reference voltage to the plurality of sub-pixels in odd ones of the plurality of horizontal pixel lines through the first reference line; and supplying the second reference voltage to the plurality of sub-pixels in even ones of the plurality of horizontal pixel lines through the second reference line.

16. The method of claim 15, wherein each of a number of adjacent sub-pixels of the plurality of sub-pixels is supplied by one of the first or second reference lines through an extension line along the horizontal direction.

17. The method of claim 15, wherein the first and second reference lines are alternately disposed by two adjacent sub-pixels along the horizontal direction.

18. The method of claim 14, wherein the first reference voltage is supplied to the plurality of sub-pixels in the (n)th horizontal pixel line through the first reference line, and the second reference voltage is supplied to the plurality of sub-pixels in the (n+1)th horizontal pixel line through the second reference line.

19. The method of claim 14, wherein the turn-on sections of the sensing voltages supplied to the (n)th and (n+2)th horizontal pixel lines are separated in time from and do not overlap each other by two horizontal periods.

20. A display device, comprising:

a plurality of pixels on a substrate, each of the pixels including one or more sub-pixels;

a plurality of pixel groups, each of the pixel group having at least two pixels arranged in a first direction, the plurality of pixel groups including even number (2N) pixel groups and odd number (2N+1) pixel groups alternately arranged along a second direction transverse to the first direction, where N is a positive integer;

a first reference line arranged along the second direction, the first reference line supplying a first reference voltage to the odd number pixel groups of the plurality of pixel groups; and a second reference line arranged along the second direction, the second reference line supplying a second reference voltage to the even number pixel groups of the plurality of pixel groups, wherein the plurality of pixel groups include (n)th, (n+1)th, and (n+2)th pixel groups sequentially arranged along the second direction, wherein turn-on sections of sensing voltages supplied to the (n)th and (n+1)th pixel groups overlap each other during a horizontal period to obtain sufficient charge time of at least one of the plurality of sub-pixels, wherein turn-on sections of sensing voltages supplied to the (n)th and (n+2)th horizontal pixel lines are separated in time from and do not overlap each other during at least one or more horizontal periods, wherein the turn-on sections of the sensing voltages supplied to the (n+1)th and (n+2)th pixel groups are separated in time from and do not overlap each other by only one horizontal period in order to insert black data, where n is a positive integer, wherein the turn-on sections of sensing voltages are two different horizontal periods, and wherein a period between the turn-on sections of the sensing voltages supplied to the (n+1)th and (n+2)th horizontal pixel lines is exactly a half of a period of the turn-on sections of sensing voltages respectively supplied to the (n)th, (n+1)th and (n+2)th horizontal pixel lines.

21. The display device of claim 20, wherein the first reference line is divided into a first branch and a second branch, and the first branch connects to a first pixel of the odd number pixel groups and the second branch connects to a second pixel adjacent to the first pixel of the odd number pixel groups, wherein the second reference line is divided into a third branch and a fourth branch, and the third branch connects to a third pixel of the even number pixel groups and the fourth branch connects to a fourth pixel adjacent to the third pixel of the even number pixel groups.

22. The display device of claim 20, wherein the turn-on sections of the sensing voltages supplied to the (n)th and (n+2)th horizontal pixel lines are separated in time from and do not overlap each other by two horizontal periods.

* * * * *